United States Patent [19]
Sato et al.

[11] Patent Number: 5,212,380
[45] Date of Patent: May 18, 1993

[54] AUTOMOTIVE ENGINE CONTROL SYSTEM WITH ROTARY ENCODER INDEXING

[75] Inventors: Seiichi Sato; Kazuo Yamaguchi; Yoshi Kurosawa, all of Tokyo; Atsushi Ueda; Masami Matsumura, both of Hyogo, all of Japan

[73] Assignees: Optec D.D. Meico Laboratory Co., Ltd.; Optec Dai-Ichi Denko Co., Ltd.; Mitsubishi Denki Kabushiki Kaisha, all of Tokyo, Japan

[21] Appl. No.: 882,176

[22] Filed: May 11, 1992

Related U.S. Application Data

[63] Continuation-in-part of Ser. No. 603,402, Oct. 26, 1990, Pat. No. 5,130,536.

[30] Foreign Application Priority Data

Oct. 26, 1989 [JP] Japan .................................. 1-279258

[51] Int. Cl.⁵ .............................................. G01D 5/34
[52] U.S. Cl. ........................... 250/231.17; 250/237 G; 123/613
[58] Field of Search ...................... 250/231.13, 231.14, 250/231.17, 237 G; 356/375; 123/406, 613

[56] References Cited
U.S. PATENT DOCUMENTS
4,145,608  3/1979  Shirasaki et al. ............... 250/231.17

*Primary Examiner*—David C. Nelms
*Attorney, Agent, or Firm*—Cushman, Darby & Cushman

[57] ABSTRACT

An automotive engine control system is provided for an automobile having a variable rotation speed engine which has a plurality of spark plugs served by respective spark plugs. The system includes an optical rotary encoder having a rotatable pulse scale having a row of code pattern with specific light-permeable or light-deflection slits each for outputting a reference position signal and other light-permeable or light-reflection slits each adapted to reduce the amount of light for outputting an angular signal, both of the optical signals being photoelectronically converted and the waveform of the resultant electric signals being shaped based on threshold voltages into electric pulse signals indicative of a reference angle of 0° and the accumulated angle of rotation, in which the circumferential width of each specific reference slit is made narrower than that of other slit so that the pulse width for angular position-indicating of the angular pulse signal is always equal and constant for ensuring more accurate detection of the angle of rotation. As the engine rotation speed is sensed to speed up and slow down, by a sensor that is operatively connected with the engine, the optical rotary encoder varies igniting of the spark plugs.

3 Claims, 3 Drawing Sheets

AUTOMOTIVE ENGINE CONTROL SYSTEM WITH ROTARY ENCODER INDEXING

REFERENCE TO RELATED APPLICATION

This is a continuation-in-part of application U.S. Pat. No. 07/603,402, filed Oct. 26, 1990, now U.S. Pat. No. 5,130,536, issued Jul. 14, 1992.

BACKGROUND OF THE INVENTION

1. Field of the Invention

The present invention concerns an optical rotary encoder for detecting the angle cf rotation of a rotatable pulse scale based on an angular signal in accordance with the angle of rotation and a reference position signal indicative of 0° for the angle.

2. Description of the Prior Art

An optical rotary encoder has been used as a means for detecting the crank angle of an automobile engine, for example, in a case of controlling the ignition timing to a spark plug or in a case of varying the ignition timing in accordance with the number of rotations of the engine.

The optical rotary encoder of the prior art, as shown in FIG. 5 of the appended drawings, has a code pattern $C_1$ for detecting an angle of rotation and a code pattern $C_2$ for detecting a reference position formed in two concentric rows on a rotatable pulse scale 1 such that two kinds of optical pulse signals are respectively outputted.

Light is projected from two light-emitting devices 51 and 52 by way of two light-emitting optical fibers 53 and 54 into the code patterns $C_1$ and $C_2$, respectively. Then, optical pulse signals outputted from the patterns are sent by way of two light-receiving optical fibers 55 and 56 and then optoelectronically converted through respective photoreceiving devices 57 and 58, thereby causing these devices to detect an angular signal $S_1$ and a reference position signal $S_2$.

For instance, in a six-cylinder engine, a code pattern $C_2$ is formed for judging respective cylinders such that the reference position signal $S_2$ is outputted on every 60° rotation of the pulse scale 1, and the timing for ignition is controlled depending on the number of pulses contained in the angular signal $S_1$ after the input of the pulse of the reference position signal $S_2$.

More specifically, a crank angle detected based on the angular signal $S_1$ and the number of rotations of the engine detected based on the reference position signal $S_2$ are inputted to an ignition system 60 for igniting each of spark plugs 63, 63, --- of the engine.

The ignition system 60 comprises a conversion table 61 for the number of rotations and the ignition timing, in which the crank angle indicative of the ignition timing for each of the cylinders corresponding to the engine rotation speed is previously set.

The ignition system also comprises a comparison means 62 for comparing the crank angle indicative of the ignition timing and the crank angle detected by the optical rotary encoder 1. In this system, the ignition timing for each of the cylinders corresponding to the rotation speed detected by the engine rotation speed sensor is outputted from the conversion table 61 for the number of rotations and the ignition timing, to the comparison means 62, and the comparison means 62 outputs a signal for igniting each of the spark plugs 63, 63, --- of the corresponding cylinder when the crank angle indicative of the ignition timing and the crank angle detected by the optical rotary encoder agree with each other.

The rotational shaft of the pulse scale 1 is connected with the crank shaft of an engine, while a control device 59 equipped with electronic parts sensitive to heat or vibrations such as light-emitting devices, 51, 52 and photoreceiving devices 57, 58 are disposed within the dashboard, in front of the driver's seat, remote from the engine, so that these devices are protected against direct affects of heat or vibrations from the engine.

However, if the light-emitting devices 51, 52, and the photoreceiving devices 57 and 58 are disposed each in pairs, since the light-emitting optical fibers 53, 54 and the light-receiving optical fibers 55, 56 have to be connected by means of respective optical connectors, which are each of a great diameter, it is difficult to accommodate the control device 59 in the narrow space behind an automotive dashboard.

Since the optical pulse signals outputted from a rotary encoder consist only of "1" and "0" signals, it is required to form two rows of code patterns on the pulse scale 1 and, correspondingly, two series of optical systems in order to obtain two kinds of information, that is, the angular signal and the reference position signal. This requires that the light-emitting devices 51, 52 and the photoreceiving devices 57, 58 be provided in twos, making it impossible to reduce the size of the connection portion of the device.

In addition, as the number of devices is increased, the number of relevant parts is also increased correspondingly, making the assembling work troublesome, as well as increasing the cost.

SUMMARY OF THE INVENTION

Accordingly, it is an object cf the present invention to provide an optical encoder capable of obtaining two kinds of information from an angular signal and a reference position signal, by merely disposing a row of code pattern on a pulse scale, thereby reducing the number of devices and decreasing the cost, as well as reducing the size of the connection portion between optical fibers and a control device. This optical rotary encoder incorporated into a automotive engine control system, for an automobile having a variable rotation speed engine having a plurality of cylinders served by respective spark plugs. As the engine rotation speed is sensed to speed up and slow down, by a sensor that is operatively connected with the engine, the optical rotary encoder varies igniting of the spark plugs.

In the first aspect of the present invention, the foregoing object can be attained by an optical rotary encoder in which an angular signal and a reference position signal indicative of 0° for the angle are outputted as optical pulse signals in accordance with the angle of rotation of a pulse scale and the angle of rotation of the pulse scale is detected based on the angular signal and the reference position signal, wherein the optical rotary encoder comprises:

a rotatable pulse scale having a row of code pattern formed along the circumferential direction thereof and comprising a specific light-permeable or light-reflection portion for outputting optical signals at a higher peak level containing the optical angular signal and the optical reference position signal together and a light-permeable or light-reflection portion adapted to reduce the amount of transmission light or reflection light for outputting optical signals at a lower peak level containing only the optical angular signal, and a signal processing section for discriminating binary "1" or "0" for electric pulse signals obtained by optoelectronic conversion of the optical signals and waveform shaping of the resultant electric signals based on a first threshold voltage for the angular signal which is set lower than the lower peak level and a second threshold voltage for the reference position signal which is set between the higher peak level and the lower peak level, and wherein the circumferential width of the specific light-permeable or light-reflection portion is made narrower than that of other light-permeable or light-reflection portion in the code pattern of the pulse scale, so that the width of the electrical signal pulse at the higher peak level obtained by the waveform shaping is made equal with the width of the electric signal pulse at the lower peak level obtained by the waveform shaping, each based on the first threshold voltage.

In the present invention, a code pattern formed along the circumferential direction of a pulse scale comprises a specific light-permeable or light-reflection portion and a light-permeable or light-reflection portion formed so as to reduce the amount of transmission light or reflection light. Accordingly, optical signals comprising an angular signal and a reference position signal superposed thereon is outputted as an optical signal at a higher peak level from the specific light-permeable or light-reflection portion, while optical signals at a lower peak level are outputted as an angular signal from other light-permeable or light-reflection portion.

Then, the optical signals containing two kinds of information for the angular signal and the reference position signal present together are optoelectronically converted and the resultant electric signal is shape into a pulse waveform by comparison with first and second threshold (reference) voltages.

Since the first threshold voltage for the angular signal is set to a predetermined value which is lower than the lower peak level, all of the electric pulses are detected as the angular signal.

On the other hand, since the second threshold voltage for the reference position signal is set between the higher peak level and the lower peak level, only the pulse at the higher peak level outputted from the specific light-permeable or light-reflection portion in the code pattern of the pulse scale is detected as the reference position signal.

That is, by projecting the light outputted from a light-emitting device onto one code pattern of the pulse scale, a series of optical pulse signals containing two kinds of information comprising a portion at a higher peak level and another portion at a lower peak level is outputted, and the signal detected by one photoreceiving device can be separated into the angular signal and the reference position signal.

Accordingly, the required number of the light-emitting devices and the photoreceiving devices can be reduced to one of each to decrease the number of parts and, accordingly, to reduce the labor needed for the assembling operation, and thereby decrease the cost. In addition, the size of the connection portion for connecting the light-emitting and light-receiving optical fibers with the connection device can be reduced in size.

In particular, in the present invention, since the circumferential width of the specific light-permeable or light-reflection portion in the code pattern formed on the pulse scale is made narrower as compared with that of other light-permeable or light-reflection portions, so that the width of the electric signal pulse at the higher peak level obtained by the waveform shaping is made equal with the width of the electric signal pulse at the lower peak level obtained by the waveform shaping each based on the first threshold voltage, the pulse width of the angular signal is always equal with respect to each of the portions in the code pattern and the angle of rotation can be detected at a high accuracy.

In the second and more specific aspect of the present invention, the optical rotary encoder of the above-mentioned type comprises:

(A) a rotatable pulse scale having a row of code pattern formed along the circumferential direction thereof and comprising a specific light-permeable or light-reflection portion for outputting optical signals at a higher peak level containing an optical angular signal and an optical reference position signal together, and a light-permeable or light-reflection portion adapted to reduce the amount of transmission light or reflection light for outputting optical signals at a lower peak level containing only the optical angular signal, and (B) a control device having, a light emitting device for projecting light onto the code pattern, and a photoreceiving device for receiving from the code pattern two kinds of the optical signals outputted being which signals are superposed one upon the other, and converting them into electric signals, and also having, a pair of threshold voltage generation means, one of these means generating a first threshold voltage which is lower than the peak level of the electric signal when only the angular signal is inputted, and the other of these threshold voltage generation means generating a second threshold voltage which is higher than the peak level of the electric signal when only the angular signal is inputted and lower than the peak level of the electric signal when both of the angular signal and the reference position signal are inputted simultaneously, and a pair of signal processing means, one of these means comparing the electric signal outputted from the photoreceiving device with the first threshold voltage to discriminate the absence or presence of the angular signal as binary "0" or "1", and the other of these signal processing means comparing the electric signal outputted from the photoreceiving device with the second threshold voltage to discriminate the absence or presence of the reference position signal as binary "0" or "1", so that the pulse signal outputted from the photoreceiving device is separated into an angular signal and a reference position signal, and wherein the circumferential width of one of the specific light-permeable portion and light-reflection portion is made narrower than that of other of the light-permeable portion and light-reflection portion in the code pattern, so that the width of the electric signal pulse at the higher peak level obtained by the waveform shaping is made equal with the width of the electric signal pulse at the lower peak level obtained by the waveform shaping each, based on the first threshold voltage.

BRIEF DESCRIPTION OF THE DRAWINGS

These and other objects, as well as advantageous features of the present invention will become apparent by reading explanations for the preferred embodiments of the present invention in conjunction with the accompanying drawings, wherein.

DESCRIPTION OF THE PREFERRED EMBODIMENTS

The present invention will not be described by way of its preferred embodiments with reference to the accompanying drawings.

Figure 1:
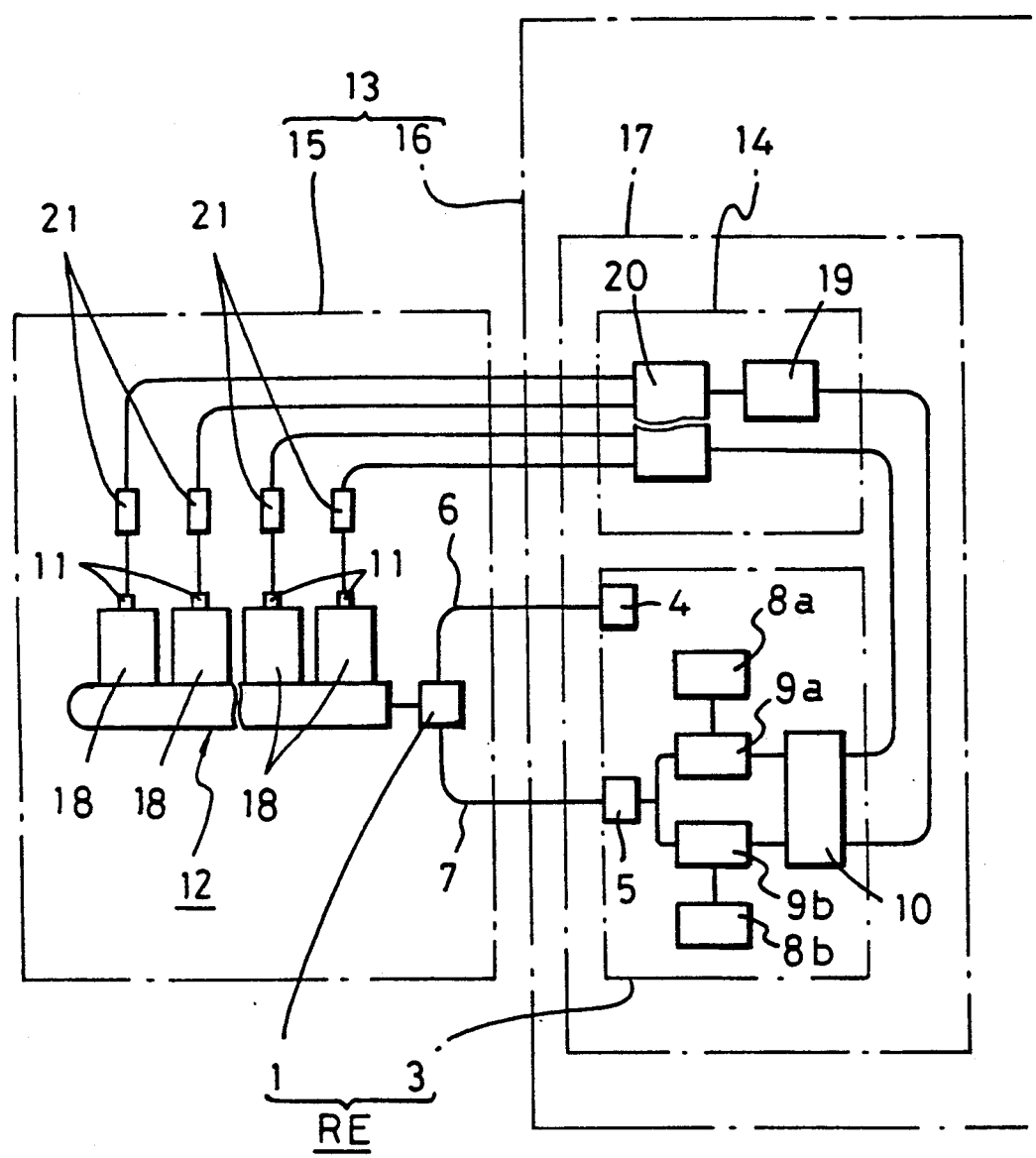
FIG. 1 is a flow sheet illustrating an automotive control system embodying the principles of the present invention.

Referring first to FIG. 1, the automotive engine control system of the present invention comprises an automobile 13 having a variable rotation speed engine 12 having a plurality of cylinders 12, an ignition system 14 operatively connected with spark plug devices 11, and an optical rotary encoder RE for detecting the rotation speed and the crank rotation angle of the engine 12 and outputting the detected rotation speed and the crank rotation angle to the ignition system 14.

The automobile comprises an engine compartment 15 containing the engine 12 and a driver's compartment 16 which is isolated from the engine compartment 15 and has a dashboard 17 in which a control device 3 for the optical rotary encoder RE is disposed such that it is isolated from heat and vibrations from the engine 12.

Figure 2:
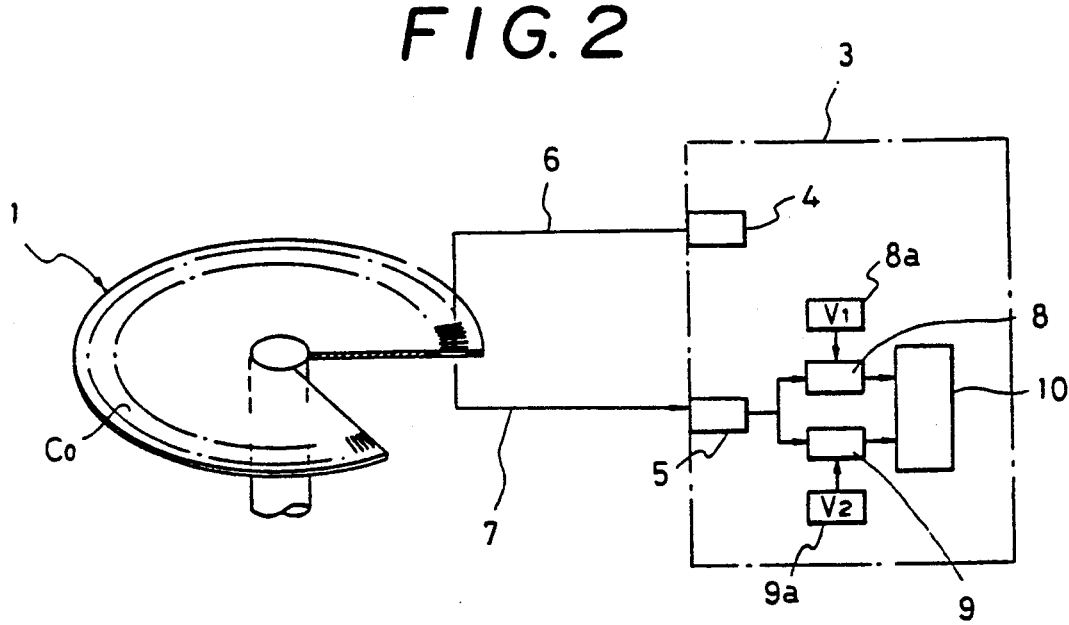
FIG. 2 is a diagrammatic view illustrating an optical rotary encoder used in the automotive control system of FIG. 1.
Figure 3:
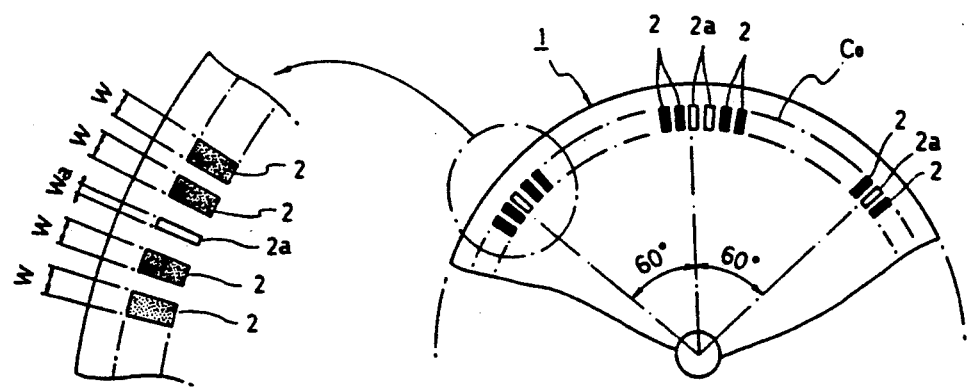
FIG. 3 is an enlarged fragmentary elevational view, and a detail thereof at further enlargement, of the pulse scale of the optical rotary encoder of FIG. 2.
Figure 4:
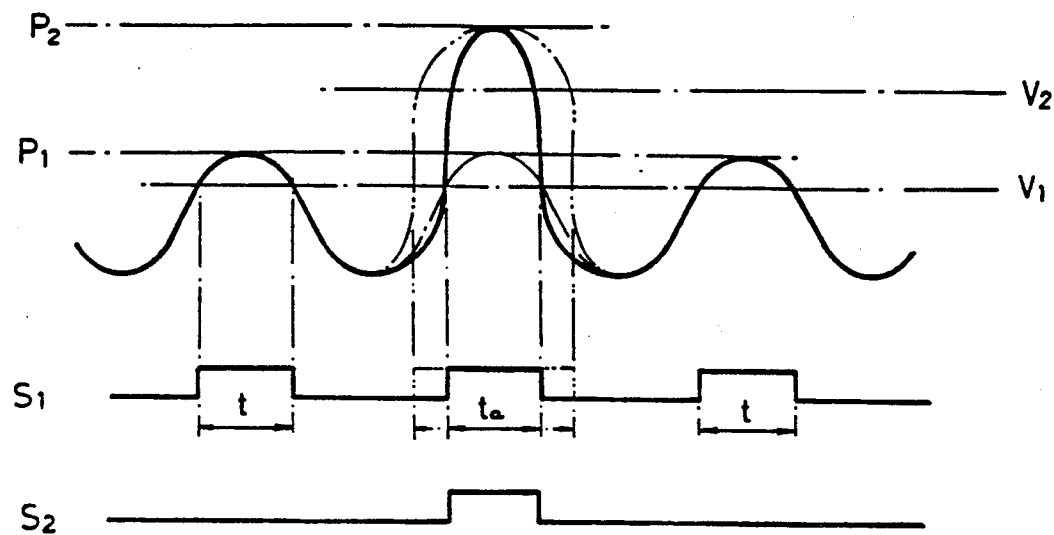
FIG. 4 is a graph illustrating a relationship between the signal waveform and the pulse width for the optical rotary encoder of FIG. 2.
Figure 5:
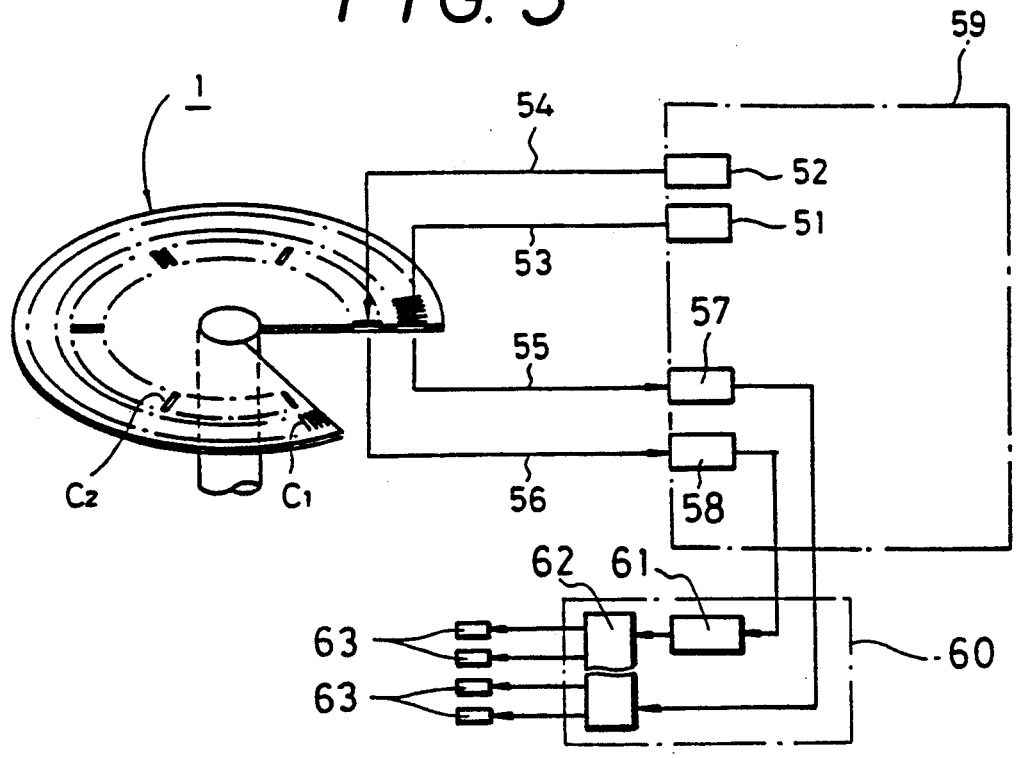
FIG. 5 is an explanatory flow sheet illustrating a prior art optical rotary encoder for an automotive control system.

Referring now to FIGS. 2-4, in the preferred embodiment, a transmission-type optical rotary encoder is used as the rotary encoder RE, in which a code pattern $C_0$ comprising a plurality of slits 2, 2, ---- as a light-permeable portion is formed circumferentially on a pulse scale 1. Each of the slits is formed at a predetermined circumferential interval When the encoder is used as a crank angle sensor, for example, of a six-cylinder engine, the pulse scale 1 is so attached that it rotates interlocking with the crank shaft 18. Each of the slits 2, 2, ----- is formed with an optical attenuation film for reducing the amount of transmitted light, except for specific slits 2a, 2a, each formed at an angular interval of 60° for outputting a reference position signal $S_2$.

Specifically, the code pattern $C_0$ is formed, for example, by vapor depositing a chromium metal layer on the surface of the pulse scale 1 made of a circular glass plate, to render the entire surface nontransparent, except for the slit portion. The thickness of the vapor-deposited chromium layer is reduced at the portions for the slits 2, 2, --- so as to form a semitransparent optical attenuation film, while chromium metal is not deposited at all at the portions for the specific slits 2a, 2a, --- to expose the transparent glass substrate as it is.

Accordingly, an optical pulse signal at a lower peak level $P_1$ corresponding to an angular signal $S_1$ is outputted through each of the slits 2, 2, ---. Meanwhile, an optical pulse signal at a higher peak level $P_2$ corresponding to a combination of the angular signal and a reference position signal $S_2$ is outputted through each of the specific slits 2a, 2a, --- at a predetermined period.

Thus, a series of optical pulse signals containing signals of different levels are outputted together.

The circumferential width Wa of the specific slit 2a is made narrower than the circumferential width W of other slit 2. As shown in FIG. 4, the width of a signal wave outputted from the slit 2a is narrower at the bottom of its waveform than that outputted from other slit 2 and equal at the middle height of its waveform to that outputted from other slit 2.

The slits ar formed such that the angle made between the center lines for adjacent slits is equal with respect to the center of the pulse scale 1 and, therefore, the peak position of the signal waveform is not deviated circumferentially, even if the width of the specific slit 2a is made narrower.

Then, when the outputted optical signal is photoelectronically converted, the electric signal thus obtained also has a similar waveform. If a reference voltage $V_1$ as a threshold value for the angular signal $S_1$ is set to such a level at which the width $t_a$ of the signal waveform outputted from the specific slit 2a is equal to the width t of the signal waveform outputted from the other slit 2, the pulse width of any pulse signal indicative of the angle of rotation of the pulse scale 1 is always made equal and constant.

A control device 3 has a pair of a light-emitting device 4 and a photoreceiving device 5. A light-emitting optical fiber 6 and a light-receiving optical fiber 7 are connected each at one end thereof to the light-emitting device 4 and the photoreceiving device 5 and opposed to each other at the other ends thereof on both sides of the code pattern $C_0$.

The photoreceiving device 5 is connected to a signal-processing section 8 for discriminating between binary "0" and "1" in the electric angular signal $S_1$, and a signal-processing section 9 for discriminating between binary "0" and "1" in the electric reference position signal $S_2$.

The signal-processing sections 8 and 9 are connected, respectively, with reference voltage-setting circuits 8a and 9a, respectively.

The reference (threshold) voltage $V_1$ in the signal-processing section 8 for the angular signal $S_1$ is set by the reference voltage-setting circuit 8a to lower than a lower peak level $P_1$ when only the angular signal $S_1$ is inputted, and a signal at a level higher than the reference voltage $V_1$ is discriminated to be "1".

Further, the reference (threshold) voltage $V_2$ in the signal-processing section 9 for the angular signal $S_2$ is set by the reference voltage-setting circuit 8b to lower than a lower peak level $P_2$ when the angular signal $S_1$ and the reference position signal $S_2$ are inputted simultaneously and higher than the peak level $P_1$ when only the angular signal $S_1$ is inputted, and a signal at a level higher than the reference voltage $V_2$ is discriminated to be "1".

Accordingly, as shown in FIG. 4, an optical signal waveform containing the angular signal $S_1$ and the reference position signal $S_2$ superposed thereon is inputted to and photoelectronically converted by the photoreceiving device 5. Then, the converted signal can be separated by each of the signal processing sections 8 and 9 into the angular signal $S_1$ and the reference position signal $S_2$.

In FIGS. 1 and 2, reference numeral 10 denotes a mathematical processing device for calculating the angle of crank rotation by counting the number of pulses in the angular signal $S_1$ while referring to a reference position signal $S_2$, and calculating the rotation speed of the engine 12 based or the reference positional signal $S_2$ indicative of 0°, thereby outputting the crank rotation angle and the rotation speed to the ignition system 14.

The ignition system 14 has a conversion table 19 for the number of rotations and the ignition timing, in which crank angles indicative of the ignition timing for each of the cylinders 18 correspond into the engine rotation speed are previously set, and a comparison means 20 for comparing the crank angle indicative of the ignition timing with the crank rotation angle detected by the optical rotary encoder.

The ignition timing for each of the cylinders 18 corresponding to the detected rotation speed is outputted from the conversion table 19 for the number of rotation and the ignition timing to the comparison means 20. When the crank angle indicative of the ignition timing agrees with the crank angle detected by the optical rotary encoder, the comparison means 20 outputs a signal for igniting the spark plug 11 of the corresponding cylinder 18.

Reference numeral 21 denotes ignition coils.

The function and the operation of the optical rotary of the automotive engine control system according to the present invention as shown in FIGS. 1 14 4 will now be described in more detail.

At first, the light-emitting optical fiber 6 for projecting light emitted from the light-emitting device 4 to the code pattern $C_0$, and the light-receiving optical fiber 7 for guiding the optical pulse signal outputted from the code pattern $C_0$ to the photoreceiving device 5 are connected collectively by way of a connector (not illustrated) to the control device 3.

That is, since only one of each of the light-emitting device and the photoreceiving device 5 is necessary in this embodiment, the size of the connector for connecting the optical fibers 6 and 7 to the light-emitting device 4 and the photoreceiving device 5 can be reduced. Then, the control device 3 can be housed easily within a narrow dashboard space, and the operation for connecting the control device 3 with the optical fibers 6 and 7 can be simplified.

Further, since the code pattern $C_0$ for outputting the optical signal waveform comprising the angular signal $S_1$ and the reference position signal $S_2$ superimposed thereon is formed on the pulse scale 1, an optical signal wave at a lower peak level is outputted as the angular signal $S_1$, while a portion in which the reference position signal $S_2$ is superimposed is outputted from the specific slit 2a as an optical signal waveform at a higher peak level.

Then, the pulse signals obtained by photoelectronically converting the optical signal waveform containing the two kinds of information in the photoreceiving device 5 are inputted into the signal-processing section 8 for discriminating between "1" and "0" of the angular signal $S_1$ and to the signal processing section 9 for discriminating between "1" and "0" of the reference position signal $S_2$.

In the signal-processing section 8, since the reference voltage $V_1$ is set lower than the lower peak level $P_1$, the signal waveform outputted from all of the slits in the code pattern ca be shaped into a pulse waveform and detected as the angular signal.

In this case, if the width for each of the slits is equal, the pulse width $t_a$ for the angular signal $S_1$ outputted from the specific slit 2a would be widened (as shown by the chained line in FIG. 3) and, therefore, the pulse width in that portion may be different from that in other portions relative to the rotational angle of the pulse scale, which would possibly lower the accuracy for the detected angle. In the present invention, this drawback can be overcome as described below.

In this embodiment, the width of the specific slit 2a is made narrower than that of other slits such that the width of the pulse obtained by shaping the signal waveform outputted from the specific slit 2a based on the reference voltage $V_1$ for the angular signal $S_1$ is made equal with the width of the pulse obtained by shaping the signal waveform outputted from the other slits 2, 2. That is, the reference voltage $V_1$ is set to such a level at which the width of the signal waveform at the higher peak level outputted from the specific slit 2a agrees with the width of the signal waveform at the lower peak level outputted from other slits 2.

Consequently, the angular signals whose waveform is shaped by the reference voltage $V_1$ are outputted each with an equal pulse width, irrespective of their difference in peak level. In addition, since the angular pitch between the center lines cf any two adjacent slits 2 and 2 is made equal, the pulse width of the angular signal $S_1$ is always equal with respect to the angle of rotation of the pulse scale 1 and the angular signal with the number of pulses corresponding to the angle of rotation is outputted, by which 360° angle for the rotation of the pulse scale 1 can be detected accurately based on the pulse period of the angular signal $S_1$.

Further, in the signal-processing section 9, since the value for the reference voltage $V_2$ as the threshold value for the reference position signal $S_2$ is set between the higher peak level $P_2$ and the lower peak level $P_1$ so that only the signal waveform outputted from the specific slit 2a can be detected, only the signal at the higher peak level can be detected as the reference position signal $S_2$.

Then, the waveform for the angular signal $S_1$ and the reference position signal $S_2$ are shaped in the signal-processing sections 8 and 9 based on the reference voltages $V_1$ and $V_2$ which are set in accordance with the difference for the peak levels $P_1$ and $P_2$, respectively, and are then inputted as pulse signals to the mathematical processing device 10.

The mathematical processing device 10 discriminates two reference position signals "1" inputted successively as the signal indicative of 0° of angle and discriminates the reference position signal "1" inputted by only one as a cylinder-discriminating signal which is outputted on every 60° rotation. The mathematical processing device 10 also detects the angle of rotation of the pulse scale 1 by counting the number of pulses in the angular signal $S_1$ while referring to the reference position signal $S_2$ and accumulating the angle of rotation for one pulse period.

In this way, since the angular signal $S_1$ and the reference position signal $S_2$ can be extracted from a series of signals, it is only necessary to dispose the light-emitting device 4 and the photoreceiving device 5 and the light-emitting and light-receiving optical fibers 6 and 7 each by one, the number of parts can be reduced to decrease the cost and reduce the size of the connector.

Then, when the detected crank rotation angle agrees with a previously set ignition angle for each of the cylinders 18, it outputs a signal for igniting the spark plug of the cylinder 18 corresponding to the ignition angle.

The ignition timing can be determined not only by comparing the crank angles to each other, but also by counting a predetermined number of pulses of the angular signal from an instance at which a cylinder discriminating signal is inputted.

Further, in a case where the ignition angle for each of the cylinders is changed corresponding to the number of rotations of the engine, a conversion table for the number of rotations and the ignition angle in which the relationship between the ignition angle for each of the cylinders and the number of rotations of the engine is previously stored is provided, and the number of rotations of the engine is calculated based on the repetition period at which the reference position signal $S_2$ indicative of 0° is inputted, to determine the ignition angle based on the calculated number of rotations.

For instance, assuming that a time lag from the output of a signal for igniting the spark plug to actual sparking is constant, since the timing is delayed when the number of rotations of the engine is higher as compared with a case in which it is lower, ignition timing may be set so as to ignite the spark plug somewhat in advance.

Although the explanation has been made in regard to this embodiment as including a transmission-type optical rotary encoder, the present invention is not restricted only thereto but it is applicable also to a reflection-type optical rotary encoder. In this case, the reflectance in the specific light-reflection portion for outputting the reference position signal is made higher, while the reflectance of other light-reflection portion except for the specific light reflection portion is made lower, and the circumferential width of the specific light reflection portion is made narrower than that of the other light reflection portion.

For lower the reflectance, any of optical means can be applied. For instance, the intensity of the reflected light may be weakened by roughening the surface of the light-reflection portion, or by narrowing the area of the light-reflection portion aligned with the light projection area.

As has been described above, according to the present invention, since two kinds of information comprising the angular signal and the reference position signal are outputted from a code pattern formed on a rotatable pulse scale as a series of signals having varying light intensity, it is only necessary to use a pair of a light-emitting device for projecting light to the pattern and a photoreceiving device for detecting optical pulse signals outputted therefrom, by which the number of parts can be decreased to reduce the cost and facilitate assembling or connection of the optical fibers. In addition, since the number of the devices is decreased, the size of the connection portion between the optical fibers and the control device can be reduced so that the control device can be disposed easily even in a narrow space.

In particular, since an angular signal can always be outputted with the pulse width being equal relative to the angle of rotation, it has an excellent effect of being able to detect the rotational angle with a high accuracy.

It should now be apparent that the automotive engine control system, as described hereinabove, possesses each of the attributes set forth in the specification under the heading "Summary of the Invention" hereinbefore. Because it can be modified to some extent without departing from the principles thereof as they have been outlined and explained in this specification, the present invention should be understood as encompassing all such modifications as are within the spirit and scope of the following claims.

What is claimed is:

1. An automotive engine control system, comprising:
   an automobile having a variable rotation of speed engine having a plurality of cylinders served by respective spark plug means;
   an ignition system operatively connected with said spark plug means;
   an engine speed rotation sensor operatively connected with said engine for outputting the detected speed rotation to said ignition system; and
   an optical rotary encoder operatively connected between said engine speed rotation sensor and said ignition system for detecting a crank angle of the engine and outputting the detected crank angle to the ignition system for controlling ignition timing for said spark plug means in relation to engine speed rotation; in which
   both an angular signal and a reference position signal indicative of 0° for an angle of interest are outputted as optical pulse signals in accordance with the angle of rotation of a rotatable pulse scale, and the angle of rotation of the pulse scale is detected based on the angular signal and the reference position signal, wherein the optical rotary encoder comprises:
   a rotatable pulse scale having a row of code pattern elements formed thereon so as to extend in the circumferential direction thereof and including in said row both a first light-transmitting or light-reflecting portion for outputting optical signals at a first, higher peak level containing both the optical angular signal and an optical reference position signal together, and a second, light-transmitting or light-reflecting portion for outputting optical signals at a second, lower peak level containing only the optical angular signal, each said element having a width in said circumferential direction, elements of said first portion being interested in elements of said second portion in said row,
   a signal processing section for discriminating between binary "1" and "0" for electric pulse signals obtained by optoelectronic conversion of said optical signals and waveform shaping of the resultant electric pulse signals based on a first threshold voltage for said angular signal, which is set lower than said lower peak level, and a second threshold voltage for said reference positional signal, which is set between said higher peak level and said lower peak level, and
   the circumferential width of each of said code pattern elements in one of said first and second portions being characteristically narrower than that of each of said code pattern elements in the other of said first and second portions, by a given amount such that the width of each pulse of the electric pulse signal at the higher peak level obtained by the waveform shaping is substantially equal to the width of each pulse of the electric pulse signal at the lower peak level obtained by the waveform shaping, each based on said first threshold voltage, so that electrical pulse signals resulting from sensing elements of said first and second portions are indicative of angular position and electrical pulse signals resulting from sensing elements of said first portion are additionally indicative of a reference position; wherein said ignition system comprising:

a conversion table for the number of rotation and the ignition timing in which the engine rotation speed and the crank angle indicative of the ignition timing for each of the cylinders corresponding the engine rotation speed is previously set and a comparison means for comparing the crank angle indicative of the ignition timing and the crank angle detected by said rotary encoder; whereby the ignition timing for each of the cylinders corresponding to the rotation speed detected by said engine rotation speed sensor is outputted from the conversion table for the number of rotation and the ignition timing to the comparison means and, the comparison means outputs a signal for igniting each of the spark plugs of the corresponding cylinder when the crank angle indicative of the ignition timing and the crank angle detected by the optical rotary encoder agrees with each other.

2. An automotive engine control system as defined in claim 1, wherein:

the automobile comprises:

an engine compartment containing said engine, and driver's compartment which is isolated from said engine compartment in which a signal processing section of an optical rotary encoder is contained in the dashboard of the driver's compartment, so that the rotary encoder is isolated from heat and vibrations from said engine.

3. An automotive engine control system of claim 1, wherein both an angular signal and a reference position signal indicative of 0° are outputted as optical pulse signals in accordance with the angle of rotation of a pulse scale, and the angle of rotation of the pulse scale is detected based on said angular signal and said reference position signal, wherein the optical rotary encoder comprises:

(a) a rotatable pulse scale having a row of code pattern elements formed thereon so as to extend in the circumferential direction thereof and including in said row both a first light-transmitting or light-reflecting portion for outputting optical signals at a first, higher peak level containing both an optical angular signal and an optical reference position signal together, and a second, light-transmitting or light-reflecting portion for outputting optical signals at a second, lower peak level containing only the optical angular signal, and (b) a control device including:

a light-emitting device for projecting light onto the code pattern and a photoreceiving device for receiving both of two kinds of the optical signals resultingly outputted, which two kinds of optical signals are superposed one upon the other from the code pattern, and converting said two kinds of optical signals into two respective kinds of electric pulsed signals, a pair of threshold voltage generation means, including threshold voltage generation means for generating a first threshold voltage which is lower than the peak level of said electric pulse signals when only the angular signal is inputted and the other said threshold voltage generation means for generating a second threshold voltage which is higher than the peak level of said electric pulse signals when only the angular signal is inputted and lower than the peak level of said electric pulse signals when both of the angular signal and the reference position of signal are inputted simultaneously, and a pair of signal-processing means, one of said signal-processing means being arranged for comparing the electric pulse signals when outputted from the photoreceiving device with the first threshold voltage to discriminate the absence or presence of the angular signal as binary "0" or "1", and the other of said signal-processing means being arranged for comparing the electric pulse signals when outputted from the photoreceiving device with the second threshold voltage to discriminate the absence or presence of the reference position signal as binary "0" or "1", so that the electrical pulse signals outputted from the photoreceiving device are separated into the angular signal and the reference position signal, and wherein the circumferential width of each said first code pattern element is narrower than that of each said second code pattern element in the code pattern of the pulse scale, so that the width of each pulse of said electric pulse signals at the higher peak level is equal to the width of each pulse of said electric pulse signals at the lower peak level, each based on the first threshold voltage.

* * * * *